US006838927B2

(12) United States Patent
Oonishi

(10) Patent No.: US 6,838,927 B2
(45) Date of Patent: Jan. 4, 2005

(54) SEMICONDUCTOR INTEGRATED CIRCUIT WITH STABILIZING CAPACITY

(75) Inventor: Kenji Oonishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/330,171

(22) Filed: Dec. 30, 2002

(65) Prior Publication Data

US 2004/0008075 A1 Jan. 15, 2004

(30) Foreign Application Priority Data

Jul. 12, 2002 (JP) ....................................... 2002-204492

(51) Int. Cl.[7] .................................................. H03K 3/01
(52) U.S. Cl. ........................ 327/534; 327/540; 327/544
(58) Field of Search ................................ 327/534, 538, 327/540, 541, 543, 544; 365/227

(56) References Cited

U.S. PATENT DOCUMENTS 4,683,382 A * 7/1987 Sakurai et al. .............. 327/544
5,270,581 A * 12/1993 Nakamura .................. 327/530
5,982,226 A * 11/1999 Rincon-Mora .............. 327/541
6,404,243 B1 * 6/2002 Koch et al. ................. 327/107

FOREIGN PATENT DOCUMENTS

| | | |
|---|---|---|
| JP | 06-232349 | 8/1994 |
| JP | 2002-49443 | 2/2002 |

* cited by examiner

*Primary Examiner*—Quan Tra
(74) *Attorney, Agent, or Firm*—Burns, Doane, Swecker & Mathis, L.L.P.

(57) ABSTRACT

A semiconductor integrated circuit with stabilizing capacity has a voltage drop circuit that drops a power supply voltage to a first voltage Vcc1 and supplies the Vcc1 to a plurality of function blocks; a stabilizing capacity that stabilizes the Vcc1; and a plurality of voltage switching circuits each of which is provided in each of the function blocks and selectively switches between the Vcc1 and a base voltage Vss to produce a second voltage Vcc2 and supplies the Vcc2 to each function block, and each of the function blocks forms a capacity for stabilizing an output of the voltage drop circuit by means of its semiconductor structure by the Vcc1 and the Vcc2 applied thereto.

4 Claims, 4 Drawing Sheets

SEMICONDUCTOR INTEGRATED CIRCUIT WITH STABILIZING CAPACITY

BACKGROUND OF THE INVENTION

1. Field of the Invention

The present invention relates to a semiconductor with a stabilizing capacity in which a plurality of integrated individual function blocks are arranged and in which a power supply unit capable of controlling an arbitrary individual function block in a standby state.

2. Description of the Related Art

In recent years, a semiconductor integrated circuit (hereinafter referred to as LSI) has been made in a finer process and thus in order to keep a dielectric strength and reliability of transistors, a power supply voltage to be applied is made lower. Moreover, there has been a trend to make a sub-threshold current passing through the transistors larger. In a case of constituting an inexpensive system, however, there are many cases where a power supply voltage of a device other than an LSI can not be made lower and thus a voltage drop circuit is built in the LSI. Because the voltage drop circuit needs a load capacity for stabilizing voltage and it is also required to reduce the number of parts and to limit the number of terminals in the system, there has been a tendency to build also the load capacity in the LSI and thus, even if the LSI is made in the finer process, an effect of downsizing the area of the LSI becomes smaller.

Moreover, while a need for the LSI used in a battery-driven type portable electronic device to decrease power consumption in a standby state has increased, the voltage drop circuit must have a comparator in itself and thus the power consumption of the voltage drop circuit itself becomes large, then the LSI in which the voltage drop circuit is built, presents a technical problem of reducing power consumption in the standby state.

Technologies for reducing the power consumption of the LSI include a technology disclosed in Laid open Japanese Patent Publication Hei 06-232349 titled "SEMICONDUCTOR INTEGRATED CIRCUIT" (literature 1). According to this technology, a power supply voltage Vcc of an unused function block is switched to a base voltage Vss in a power switching circuit to bring the function block into a non-active state to thereby reduce power consumption. Moreover, one of the technologies for reducing the power consumption of the LSI in which the voltage drop circuit is built is disclosed in Laid open Japanese Patent Publication No. 2002-49443, titled "INSIDE VOLTAGE REDUCTION CONTROL SYSTEM" (literature 2). According to this technology, the voltage drop circuit is provided in each function block and voltage is reduced in each function block, whereby the power consumption of the whole LSI is reduced.

The semiconductor integrated circuit in the prior art is constituted in the manner described above and thus presents the following problems. In a case where the technology disclosed in the literature 1 is applied to the LSI in which the voltage drop circuit is built, when a power supply of the function block is switched to a base voltage Vss (earth potential) in the standby state, because a gate parasitic capacity of the function block becomes null, a stabilizing capacity of the voltage drop circuit needs to be a large value, which results in increasing a surface area of the LSI in advance. Moreover, since the technology disclosed in the literature 2 has the voltage drop circuit for each function block, the technology not only has a disadvantage in area but also increases the total amount of power consumed in the respective function blocks.

SUMMARY OF THE INVENTION

The present invention has been made to solve the above-mentioned problems. It is an object of the present invention to provide a semiconductor integrated circuit with stabilizing capacity capable of reducing an area occupied by a stabilizing capacity built in an LSI and reducing the whole area of the LSI without making an output voltage of the voltage drop circuit unstable.

Moreover, it is another object of the present invention to provide a semiconductor integrated circuit with stabilizing capacity capable of reducing a power consumption of a voltage drop circuit built in an LSI and reducing the power consumption in a standby state.

A semiconductor integrated circuit with stabilizing capacity with stabilizing capacity in accordance with the present invention is a semiconductor integrated circuit having a plurality of function blocks and including a voltage drop circuit that drops a power supply voltage supplied from the outside to produce a first voltage and supplies the first voltage to the plurality of function blocks; a stabilizing capacity that stabilizes the first voltage; and a plurality of switching circuits each of which is provided in each function block, selectively switches between the first voltage and a base voltage to produce a second voltage, and supplies the second voltage to each corresponding function block, wherein each of the function blocks forms a capacity for stabilizing an output of the voltage drop circuit by means of its semiconductor structure by the first voltage and the second voltage applied thereto.

Therefore, according to the present invention, even in a case where the function blocks are brought into a standby state, it is possible to reduce a reduction in a parasitic capacity of output voltage (fist voltage) of the voltage drop circuit, so that there is produced an effect of reducing the stabilizing capacity of the voltage drop circuit built in the LSI without making the output of the voltage drop circuit unstable.

Moreover, according to the present invention, the voltage drop circuit has a driver supplied with the first voltage by the power supply voltage; a base voltage generating circuit that generates a base voltage; and a plurality of comparators each of which compares the base voltage with the first voltage, controls the driver so as to keep the first voltage at a predetermined value, has a different sensitivity, and is switched in response to variations in the first voltage. Therefore, there is produced an effect of reducing the current consumption of the voltage drop circuit in the standby state and optimizing the power consumption of the voltage drop circuit in the standby state and in the ordinary operating state.

DETAILED DESCRIPTION OF THE PREFERRED EMBODIMENTS

The preferred embodiments of the present invention will be described below.

Embodiment 1

Figure 1:
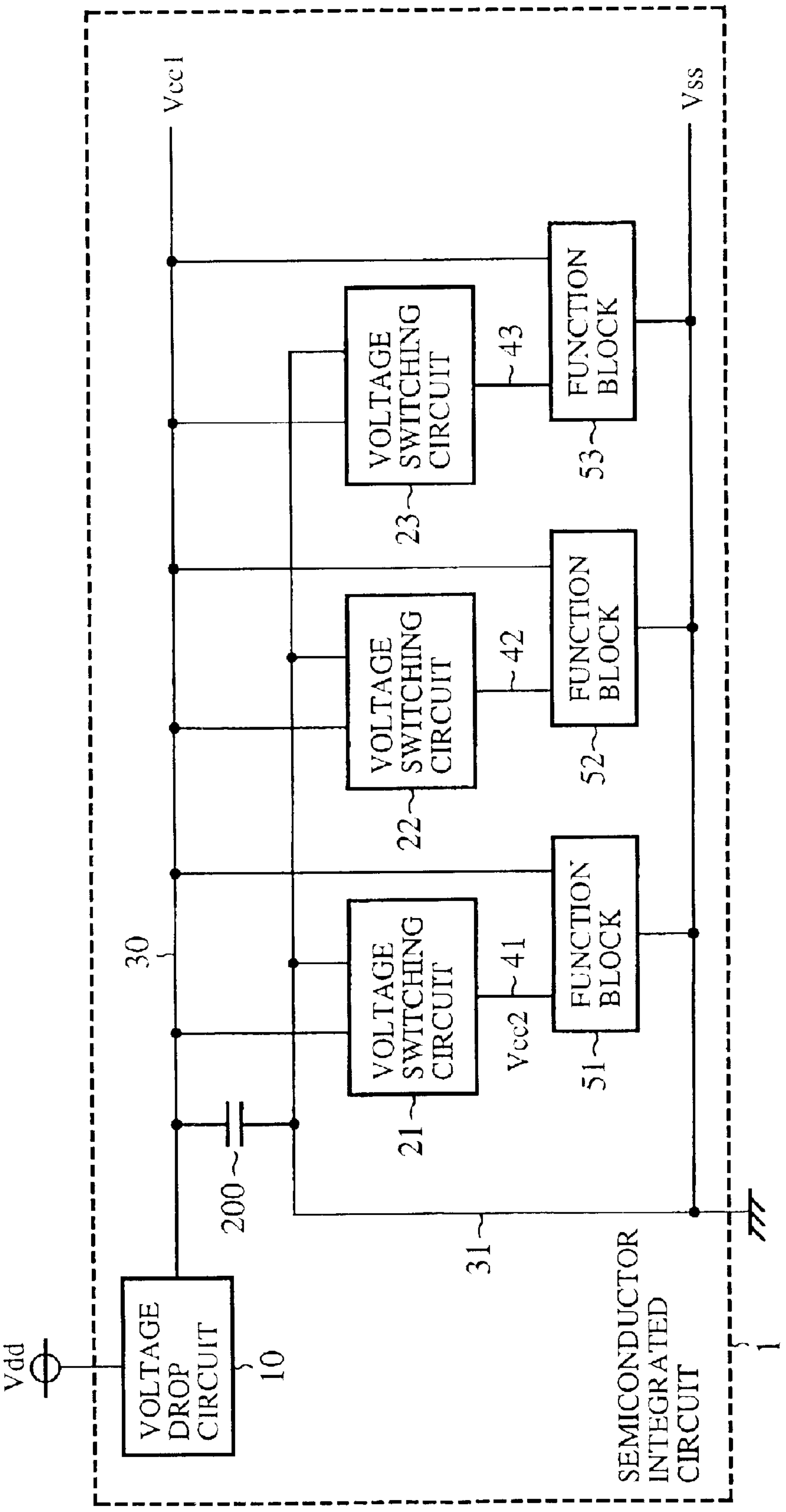
FIG. 1 is a block diagram to show a circuit constitution of a semiconductor integrated circuit with stabilizing capacity in accordance with embodiments 1 to 4 of the present invention.

FIG. 1 is a block diagram to show a circuit constitution of a semiconductor integrated circuit with stabilizing capacity in accordance with embodiments 1 to 4 of the present invention. In the drawing, a reference symbol Vdd denotes a power supply voltage, Vss denotes a base voltage (for example, earth potential), 1 denotes a semiconductor integrated circuit, 10 denotes a voltage drop circuit that drops the power supply voltage Vdd to a voltage Vcc1 (first voltage) to output, each of 21, 22 and 23 denotes a voltage switching circuit that switches between the voltage Vcc1 and the base voltage Vss to produce a voltage Vcc2 (second voltage), 30 denotes a voltage line of output voltage Vcc1 of the voltage drop circuit 10, 31 denotes a voltage line of the base voltage Vss, each of 41, 42 and 43 denotes a voltage line of the output voltage Vcc2 outputted by each of the voltage switching circuits 21, 22 and 23. Each of 51, 52 and 53 denotes a function block supplied with the voltage Vcc1 and the voltage Vcc2 and mounted with a function cell such as a logic circuit, a memory and an analog cell, and 200 denotes a stabilizing capacity of the voltage drop circuit 10, which is usually constructed of a CMOS capacity.

Figure 2:
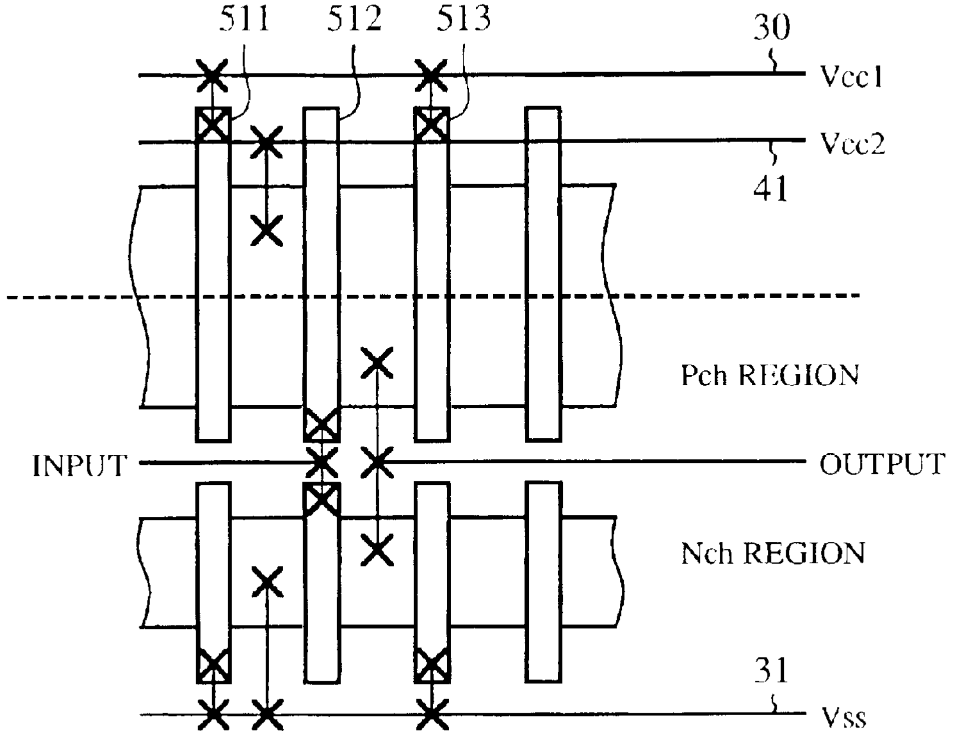
FIG. 2 is an explanatory diagram to show a schematic constitution of an inverter in a function block in accordance with the embodiment 1.
Figure 3:
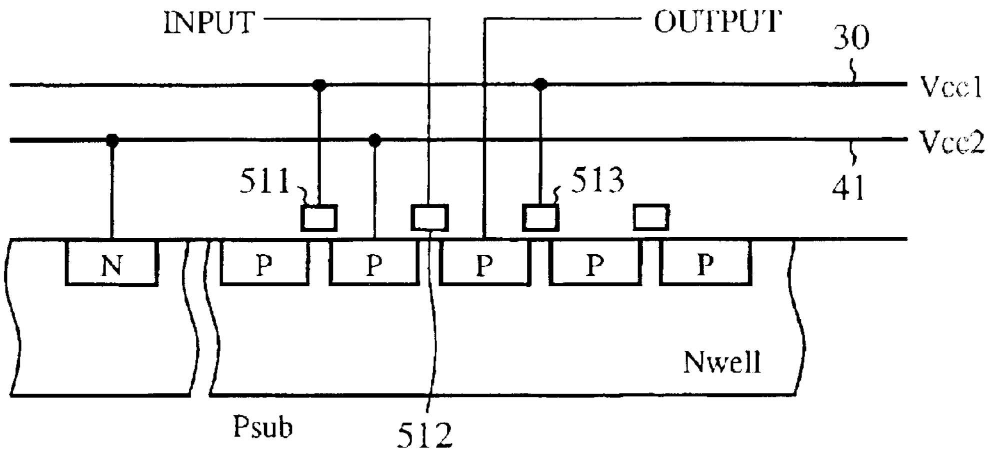
FIG. 3 is an explanatory diagram to show a cross sectional structure of a Pch region of the inverter in accordance with the embodiment 1.

FIG. 2 is an explanatory diagram to show a schematic constitution of an inverter arranged in the function block 51 in FIG. 1, and FIG. 3 is an explanatory diagram to show a cross sectional structure of a Pch region in FIG. 2. In the drawings, reference numerals 511 and 513 denote device isolation gates and 512 denotes a Pch gate of a transistor constituting the inverter.

Figure 4:
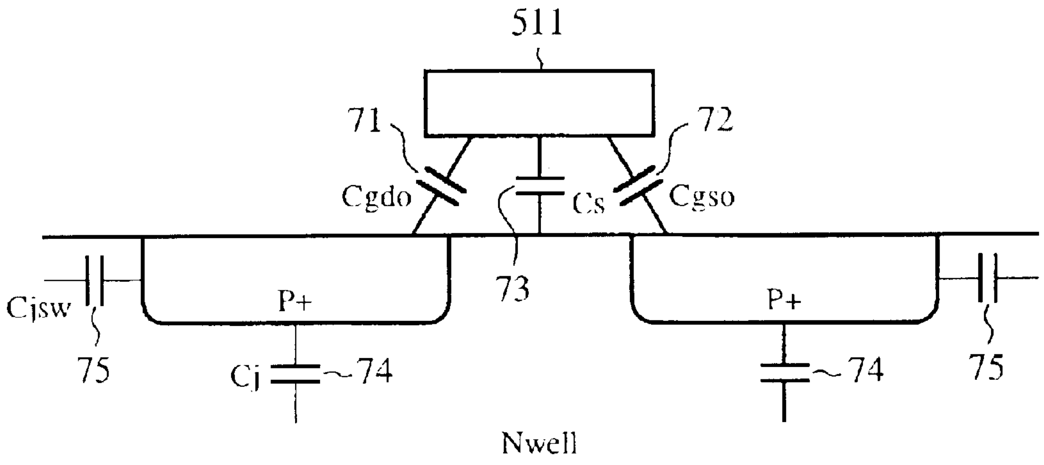
FIG. 4 is an explanatory diagram to show a parasitic capacity of a device isolation gate in accordance with the embodiment 1.

FIG. 4 is an explanatory diagram to show a parasitic capacity of the device isolation gate 511. In the drawing, a reference numeral 71 denotes a drain overlap capacity Cgdo, 72 denotes a source overlap capacity Cgso, 73 denotes a gate area capacity Cs, 74 denotes junction capacities Cj of a source and a drain, and 75 denotes a peripheral junction capacity Cjsw.

In an ordinary operation, voltage equal to the voltage Vcc1 is supplied as the voltage Vcc2 of the lines 41, 42 and 43 and the respective function blocks 51, 52 and 53 are operated by two power sources of the voltage Vcc1 and the base voltage Vss. At this time, an Nwell and a source of an inverter (transistor) are at the same potential as the voltage Vcc1 and in the device isolation gates 511 and 513, only when a drain side of a device is at the level of the base voltage Vss, only the drain overlap capacity 71 functions as a capacity added to the stabilizing capacity 200. Since the device isolation gates 511 and 513 are used for isolating the device, there are few cases where sources are arranged on both sides of the gate and a drain is usually arranged on one side or both sides of the gate. Moreover, since the voltage Vcc2 is connected only to the source, only the junction capacity 74 of the source and the peripheral junction capacity 75 function as capacities added to the stabilizing capacity 200 of the voltage drop circuit 10.

When the output voltage Vcc2 of the voltage switching circuit 21 is switched to the base voltage Vss at a standby state, all of the well and the source in the Pch region become the base voltage Vss. In the function block 51, except for the device isolation gate of the Pch region, all of the well, the source and the drain become the base voltage Vss. This makes it possible to cut a sub-threshold current. At this time, the parasitic capacity of the device isolation gate becomes a total sum of the gate area capacity 73 and the source/drain overlap capacities 71, 72 and the total sum of these capacities functions as a capacity applied to the stabilizing capacity 200 of the voltage drop circuit 10. For this reason, when the function block 51 is brought into an off state, a reduction in the parasitic capacity is made smaller and thus the stabilizing capacity of the voltage drop circuit 10 can be made smaller.

As described above, according to this embodiment 1, each of the function blocks 51, 52 and 53 forms the capacity for stabilizing output voltage of the voltage drop circuit by the voltage Vcc1 and voltage Vcc2 applied thereto by means of its semiconductor structure and thus has a constitution in which the voltage Vcc2 is supplied to the P well and the source of the P type transistor and in which the voltage Vcc1 is supplied to the device isolation gate of a P type transistor region. Therefore, even when the function blocks 51, 52 and 53 are brought into the standby state, a reduction in the parasitic capacity of the voltage Vcc1 can be made smaller, which results in producing an effect of reducing the stabilizing capacity 200 that is built actually in the LSI without making the output voltage Vcc1 of the voltage drop circuit 10 unstable.

Embodiment 2

Figure 5:
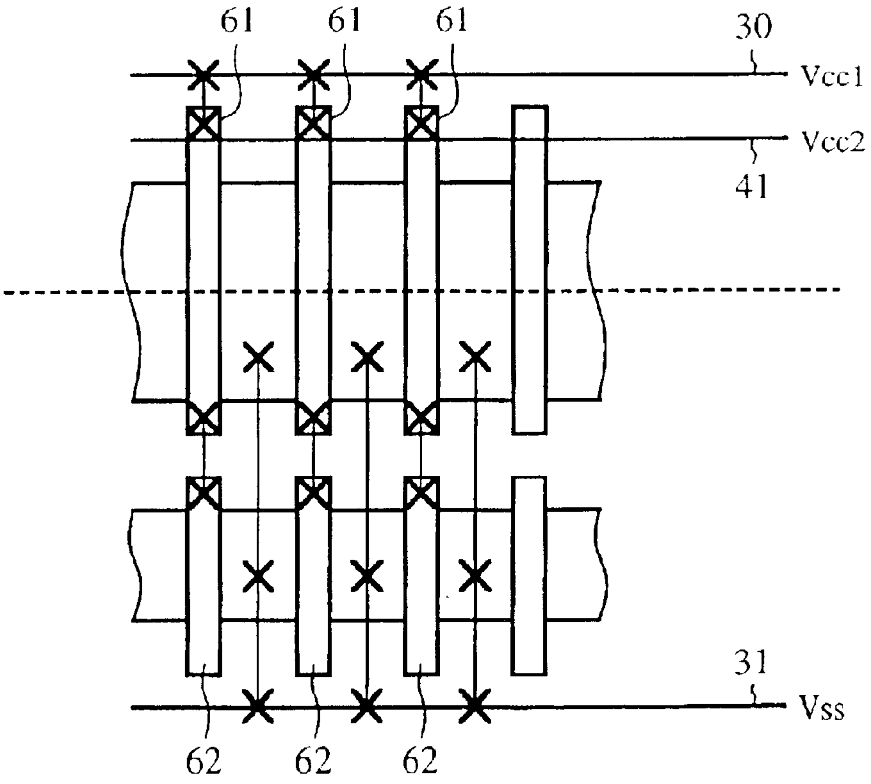
FIG. 5 is an explanatory diagram to show a schematic constitution of a logic gate in accordance with the embodiment 2.

FIG. 5 is an explanatory diagram to show a schematic constitution of a logic gate in accordance with an embodiment 2 of the present invention. In the drawing, reference numerals 61, 62 denote gates of a Pch transistor and an Nch transistor that are not used for constituting a logic. The gates 61, 62 are connected to the line 30 of output voltage Vcc1 of the voltage drop circuit 10 and the source and the drain are connected to the voltage line 31 of the base voltage Vss.

In a case where the voltage Vcc2 is at the same potential as the voltage Vcc1, a fringe capacity of the gate 61 and an area capacity and a fringe capacity of the gate 62 function as capacities added to the stabilizing capacity 20 of the voltage drop circuit 10. In a case where the voltage Vcc2 is switched to the base voltage Vss, in addition to the capacity described above, an area capacity of the gate 61 functions as a capacity for stabilization, so that when the function blocks 51, 52 and 53 are brought into the standby state, the capacity for stabilizing the voltage drop circuit 10 increases. This effect makes it possible to complement a reduction in the capacity of a functional device of a macro cell.

As described above according to the embodiment 2, in the semiconductor structures of the respective function blocks 51, 52 and 53, the voltage Vcc2 is supplied to the P well and the source of the P type transistor and the voltage Vcc1 is supplied to a gate that is in the P type transistor region and does not function in operation, so that even when the function blocks 51, 52 and 53 are brought into the standby state, there is produced an effect of reducing the stabilizing capacity 200 that is actually built in the LSI without making the output voltage Vcc1 of the voltage drop circuit 10 unstable.

Embodiment 3

Figure 6:
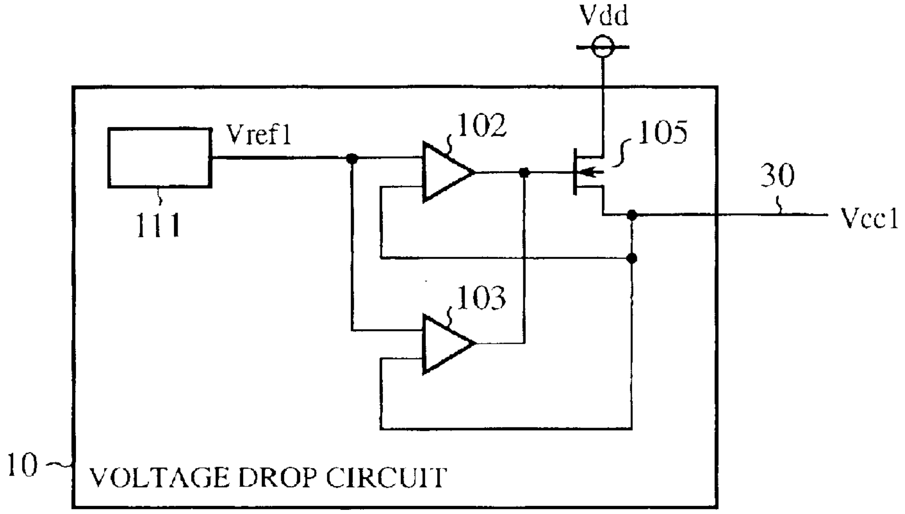
FIG. 6 is a circuit diagram to show a constitution of a voltage drop circuit in accordance with the embodiment 3.

FIG. 6 is a circuit diagram to show a constitution of a voltage drop circuit in accordance with an embodiment 3 of the invention. In the drawing, reference numerals 102, 103 denote comparators and the comparator 102 is a type which has a higher sensitivity and a larger current consumption than those of the comparator 103. A reference numeral 105 denotes a driver that outputs voltage Vcc1, 111 denotes a reference voltage generating circuit that generates a predetermined reference voltage Vref1 of the voltage Vcc1.

Each of the comparators 102, 103 compares the reference voltage Vref1 generated by the reference voltage generating circuit 111 with the output voltage Vcc1 and, when the voltage Vcc1 becomes decreasing, controls the driver 105 so as to keep a predetermined value and the control is shared as follows by the comparators 102, 103.

In an ordinary operation in which all the function blocks 51, 52 and 53 are operated, because variations in the output voltage Vcc1 are large, the comparator 102 having a higher sensitivity is used and the comparator 103 having a lower sensitivity is brought into a dormant state, whereas in a case where any one of the function blocks 51, 52 and 53 is brought into a standby state, if the number of function blocks in the standby state is large, variations in the voltage Vcc1 are reduced according to the number of function blocks. In this case, the comparator 103 having the lower sensitivity is used and the comparator 102 having the higher sensitivity is brought into the dormant state. The switching of the comparators is performed by a control circuit (not shown) that controls the standby states of the function blocks. By this arrangement the current consumption of the voltage drop circuit 10 can be reduced. In this case only the comparators having different sensitivities are added to a usual arrangement of the voltage drop circuit in the prior art, so that the current consumption can be reduced without increasing the area of the LSI.

As described above according to the embodiment 3, the voltage drop circuit 10 has a plurality of comparators 102, 103 having different sensitivities and, when the voltage Vcc1 is changed according to the number of function blocks 51, 52 and 53 for which the base voltage Vss is selected as the voltage Vcc2 by the voltage switching circuits 21, 22 and 23, the sensitivity of the comparator is switched in response to a change in the number of function blocks 51, 52 and 53. Therefore, there is produced an effect of reducing the current consumption of the voltage drop circuit 10 in the standby state.

Embodiment 4

Figure 7:
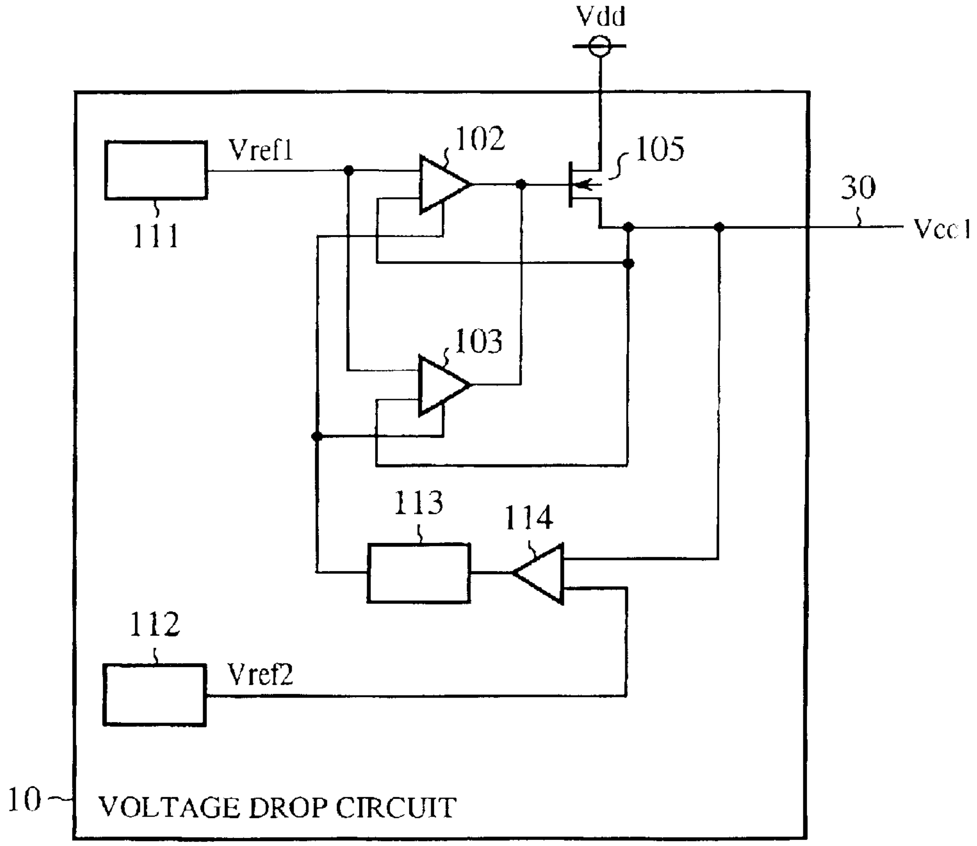
FIG. 7 is a circuit diagram to show a constitution of a voltage drop circuit in accordance with the embodiment 4.

FIG. 7 is a circuit diagram to show a constitution of a voltage drop circuit in accordance with an embodiment 4 of the present invention. In the drawing, the parts which are the same as those used in FIG. 6 will be denoted by the same reference symbols and further explanation will be omitted. A reference numeral 112 denotes a second reference voltage generating circuit that generates a reference voltage (second reference voltage) Vref2 lower than the reference voltage (first reference voltage) Vref1 of the reference voltage generating circuit 111, 113 denotes a comparator switching circuit, 114 denotes an undershoot detection circuit composed of comparators.

The driver 105 supplies the same voltage as the reference voltage Vref1 of the reference voltage generating circuit 111 as the output voltage Vcc1 of the voltage drop circuit 10 to the voltage line 30, and in a case where a capacity of the comparator is small with respect to variations in the output voltage Vcc1, the output voltage Vcc1 becomes smaller than an operating lower limit voltage of a transistor supplied with and operated by the voltage Vcc1. Thus, the reference voltage Vref2 is set at a voltage value that is lower than the reference voltage Vref1 and higher than the operating lower limit voltage of the transistor and the output voltage Vcc1 is monitored by the under shoot detection circuit 14. Even if a voltage drop occurs, in a case where the undershoot detection circuit 14 detects that the output voltage Vcc1 is lower than the reference voltage Vref2, the comparator switching circuit 113 switches the comparator 102 having the higher sensitivity to the operating state. At this time the comparator 103 that is not selected is in the dormant state.

On the other hand, with respect to variations in a case where the voltage Vcc1 is higher than the reference voltage Vref2, the output of the undershoot detection circuit 114 makes the comparator switching circuit 113 select the comparator 103 having the lower sensitivity and bring the comparator 103 into the operating state and the comparator 102 into the dormant state. By this arrangement it is made possible to set the comparator having the most suitable sensitivity and to optimize the power consumption of the voltage drop circuit 10.

In the above description, a case where there are two comparators using the reference voltage Vref1 has been described, but increasing the number of comparators makes it possible to perform a finer adjustment of power consumption. In this case, when one comparator is switched to the operating state by the output of the undershoot detection circuit, the remaining comparators are brought into the dormant state.

As described above, according to this embodiment 4, the second reference voltage generating circuit 112 generates the second reference voltage Vref2 that is lower than the first reference voltage Vref1 and higher than the operating lower limit voltage of the transistor for the plurality of comparators 102, 103 that control the driver 105 and are different from each other in the sensitivity, and the undershoot detection circuit 114 compares the output voltage Vcc1 with the second reference voltage Vref2 to output the comparison result, and then the comparator switching circuit 113 controls the comparators 102, 103 according to the comparison result so that in a case where the output voltage Vcc1 is lower than the second reference voltage Vref2, the comparator 103 having the higher sensitivity is brought into the operating state and the remaining comparator 103 is brought into the dormant state, and so that in a case where the output voltage Vcc1 is higher than the second reference voltage Vref2, the comparator 103 having the lower sensitivity is brought into the operating state and the remaining comparator 102 is brought into the dormant state. By this arrangement it is made possible to set the comparator having the most suitable sensitivity for the state of variations in the output voltage Vcc1 of the voltage drop circuit 10 and thus to produce an effect of reducing the current consumption of the voltage drop circuit 10 at the standby state and optimizing the power consumption at the standby state and at the normal operating state.

What is claimed is:

1. A semiconductor integrated circuit with stabilizing capacity having a plurality of function blocks, comprising:

a voltage drop circuit that drops a power supply voltage supplied from the outside to produce a first voltage and supplies the first voltage to the plurality of function blocks;

a stabilizing capacity that stabilizes the first voltage; and a plurality of voltage switching circuits each of which is provided in each function block, selectively switches between the first voltage and a base voltage to produce a second voltage, and supplies the second voltage to each corresponding function block, wherein parasitic capacity of a transistor caused by difference of voltage between the first voltage and the base voltage functions as capacity to complement said stabilizing capacity when said voltage switching circuit supplies said first voltage, and parasitic capacity of the transistor caused by difference of voltage between the first voltage and the second voltage functions as capacity to complement said stabilizing capacity, wherein in a semiconductor structure of each function block, the second voltage is supplied to a P well and a source of a P type transistor and the first voltage is supplied to a device isolation gate in a P type transistor region.

2. The semiconductor integrated circuit with stabilizing capacity as claimed in claim 1, wherein in the first voltage is supplied to a gate that is in a P type transistor region and the gate does not function in operation.

3. The semiconductor integrated circuit with stabilizing capacity as claimed in claim 1, wherein the voltage drop circuit includes:

a driver that is supplied with the first voltage by the power supply voltage;

a reference voltage generating circuit that generates a reference voltage; and a plurality of comparators having different sensitivities, each of which compares the reference voltage with the first voltage so as to control the driver keeping the first voltage at a predetermined value, said comparators being switched in response to numbers of the function blocks to which said voltage switching circuit supplies the base voltage as the second voltage.

4. The semiconductor integrated circuit with stabilizing capacity as claimed in claim 1, wherein the voltage drop circuit includes:

a driver that is supplied with the first voltage by the power supply voltage;

a first reference voltage generating circuit that generates a first reference voltage;

a plurality of comparators having different sensitivities, each of which compares the first reference voltage with the first voltage, so as to control the driver keeping the first voltage at a predetermined value;

a second reference voltage generating circuit that generates a second reference voltage that is lower than the first reference voltage and higher than an operating lower limit voltage of a transistor supplied with the first voltage;

an undershoot detection circuit that compares the first voltage with the second reference voltage to output a comparison result; and a comparator switching circuit that brings one of the plurality of comparators that has a higher sensitivity into an operating state and a remaining comparator into a dormant state in response to a comparison result of the undershoot detection circuit that designates a case where the first voltage is lower than the second reference voltage, and that brings one of the plurality of comparators that has a lower sensitivity into the operating state and a remaining comparator into the dormant state in response to a comparison result of the undershoot detection circuit that designates a case where the first voltage is higher than the second reference voltage.

* * * * *